United States Patent
Wei et al.

(10) Patent No.: US 11,024,356 B2
(45) Date of Patent: Jun. 1, 2021

(54) APPARATUS FOR LOW POWER WRITE AND READ OPERATIONS FOR RESISTIVE MEMORY

(71) Applicant: Intel Corporation, Santa Clara, CA (US)

(72) Inventors: Liqiong Wei, Portland, OR (US); Fatih Hamzaoglu, Portland, OR (US); Yih Wang, Portland, OR (US); Nathaniel J. August, Portland, OR (US); Blake C. Lin, Portland, OR (US); Cyrille Dray, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/565,299

(22) Filed: Sep. 9, 2019

(65) Prior Publication Data

US 2020/0020378 A1    Jan. 16, 2020

Related U.S. Application Data

(62) Division of application No. 16/052,552, filed on Aug. 1, 2018, now Pat. No. 10,438,640, which is a division
(Continued)

(51) Int. Cl.
| | |
|---|---|
| *G11C 11/16* | (2006.01) |
| *G11C 13/00* | (2006.01) |
| *G11C 29/02* | (2006.01) |

(52) U.S. Cl.
CPC .......... *G11C 11/1675* (2013.01); *G11C 11/16* (2013.01); *G11C 11/1659* (2013.01);
(Continued)

(58) Field of Classification Search
CPC ............ G11C 11/1675; G11C 11/1659; G11C 11/1677; G11C 11/1673; G11C 13/0002;
(Continued)

(56) References Cited

U.S. PATENT DOCUMENTS

| | | | |
|---|---|---|---|
| 7,656,198 B1 * | 2/2010 | Zhou | .............. H03K 19/018528 326/115 |
| 8,456,940 B2 | 6/2013 | Hanzawa et al. | |

(Continued)

FOREIGN PATENT DOCUMENTS

| | | |
|---|---|---|
| CN | 100449513 | 1/2009 |
| KR | 100676786 | 2/2007 |

OTHER PUBLICATIONS

1st Office Action dated May 15, 2017 for Chinese Patent Application 201380076998.7.
(Continued)

*Primary Examiner* — Jerome Leboeuf
(74) *Attorney, Agent, or Firm* — Green, Howard & Mughal LLP

(57) ABSTRACT

Described are apparatuses for improving resistive memory energy efficiency. An apparatus performs data-driven write to make use of asymmetric write switch energy between write0 and write1 operations. The apparatus comprises: a resistive memory cell coupled to a bit line and a select line; a first pass-gate coupled to the bit line; a second pass-gate coupled to the select line; and a multiplexer operable by input data, the multiplexer to provide a control signal to the first and second pass-gates or to write drivers according to logic level of the input data. An apparatus comprises circuit for performing read before write operation which avoids unnecessary writes with an initial low power read operation. An apparatus comprises circuit to perform self-controlled write operation which stops the write operation as soon as bit-cell flips. An apparatus comprises circuit for performing
(Continued)

self-controlled read operation which stops read operation as soon as data is detected.

17 Claims, 11 Drawing Sheets

Related U.S. Application Data of application No. 14/129,277, filed as application No. PCT/US2013/048753 on Jun. 28, 2013, now Pat. No. 10,068,628.

(52) U.S. Cl.
CPC ...... *G11C 11/1673* (2013.01); *G11C 11/1677* (2013.01); *G11C 11/1693* (2013.01); *G11C 13/0002* (2013.01); *G11C 13/003* (2013.01); *G11C 13/004* (2013.01); *G11C 13/0004* (2013.01); *G11C 13/0007* (2013.01); *G11C 13/0011* (2013.01); *G11C 13/0061* (2013.01); *G11C 13/0069* (2013.01); *G11C 29/022* (2013.01); *G11C 29/023* (2013.01); *G11C 29/028* (2013.01); *G11C 13/00* (2013.01); *G11C 2013/0071* (2013.01); *G11C 2013/0076* (2013.01); *G11C 2213/74* (2013.01); *G11C 2213/79* (2013.01)

(58) Field of Classification Search
CPC ............ G11C 13/0004; G11C 13/0007; G11C 13/0011; G11C 13/003; G11C 13/004; G11C 13/0061; G11C 13/0069; G11C 11/1693; G11C 11/16; G11C 29/022; G11C 29/023; G11C 29/028; G11C 2013/0071; G11C 2013/0076; G11C 2213/74; G11C 2213/79; G11C 13/00

See application file for complete search history.

(56) References Cited

U.S. PATENT DOCUMENTS

| | | | |
|---|---|---|---|
| 2005/0122768 | A1 | 6/2005 | Fukumoto |
| 2006/0157679 | A1 | 7/2006 | Scheuerlein |
| 2007/0263427 | A1 | 11/2007 | Sato et al. |
| 2007/0285975 | A1 | 12/2007 | Kawahara et al. |
| 2008/0168231 | A1* | 7/2008 | Ramaraju ........... G06F 12/0895 |
| | | | 711/131 |
| 2009/0135637 | A1 | 5/2009 | Takase |
| 2010/0072451 | A1 | 3/2010 | Terao et al. |
| 2010/0097841 | A1 | 4/2010 | Lu |
| 2010/0110757 | A1 | 5/2010 | Ma |
| 2010/0188909 | A1* | 7/2010 | Kenkare ............... G11C 11/419 |
| | | | 365/189.16 |
| 2011/0058406 | A1 | 3/2011 | Ma |
| 2011/0140069 | A1 | 6/2011 | Inoue |
| 2011/0228595 | A1 | 9/2011 | Rao |
| 2011/0267874 | A1 | 11/2011 | Rya |
| 2011/0280065 | A1 | 11/2011 | Rao et al. |
| 2012/0020142 | A1 | 1/2012 | Yu et al. |
| 2012/0081952 | A1 | 4/2012 | Kawahara |
| 2012/0087168 | A1* | 4/2012 | Hwang .............. G11C 13/0023 |
| | | | 365/72 |
| 2012/0163103 | A1 | 6/2012 | Hafez et al. |
| 2013/0055088 | A1 | 2/2013 | Liao et al. |
| 2014/0115237 | A1 | 4/2014 | Yoo |
| 2014/0219002 | A1 | 8/2014 | Lee et al. |
| 2014/0219009 | A1* | 8/2014 | Chow ................... G11C 11/419 |
| | | | 365/154 |
| 2014/0313812 | A1 | 10/2014 | Yim |

OTHER PUBLICATIONS

Advisory Action dated Feb. 14, 2017 for U.S. Appl. No. 14/129,277.
Final Office Action dated Dec. 1, 2016 for U.S. Appl. No. 14/129,277.
International Preliminary Report on Patentability dated Jan. 17, 2016 for PCT Patent Application No. PCT/US2013/048753.
International Search Report & Written Opinion dated Apr. 24, 2014 for PCT Patent Application No. PCT/US2013/048753.
Non Final Office Action dated Mar. 16, 2017 for Korean Patent Application No. 10-2015-7033491.
Non Final Office Action dated May 5, 2017 for U.S. Appl. No. 14/129,277.
Non-Final Office Action dated Jul. 1, 2016 for U.S. Appl. No. 14/129,277.
Non-Final Office Action dated Oct. 20, 2017 for U.S. Appl. No. 14/129,277.
Notice of 2nd Preliminary Rejection dated Sep. 19, 2017 for Korean Patent Application No. 10-2015-7033491.
Notice of Allowance for Korean Patent Application No. 10-2015-7033491, dated Mar. 29, 2018.
Notice of Allowance dated May 15, 2018 for U.S. Appl. No. 14/129,277.
Notice of Allowance dated Jun. 4, 2019 for U.S. Appl. No. 16/052,552.
Notice of Allowance dated Oct. 11, 2017 for Chinese Patent Application No. 201380076998.7.
Restriction Requirement dated Feb. 19, 2019 for U.S. Appl. No. 16/052,552.
Restriction Requirement dated Mar. 7, 2016 for U.S. Appl. No. 14/129,277.
Supplemental Notice of Allowance dated Jul. 13, 2018 for U.S. Appl. No. 14/129,277.
Hutchby, J. et al., "Assessment of the Potential & Maturity of Selected Emerging Research", Memory Technologies Workshop & ERD/ERM Working Group Meeting, Apr. 6-7, 2010, Jul. 23, 2010, p. 14.
Kawahara, T. et al., "2Mb Spin-Transfer Torque RAM (SPRAM) with Bit-by-Bit Bidirectional Current Write and Parallelizing-Direction Current Read", 2007 IEEE International Solid-State Circuits Conference. Digest of Technical Papers. San Francisco, CA, US. Feb. 11-15, 2007. Feb. 11-15, 2007.
Office Action dated Jul. 13, 2020 for German Patent Application No. 11 2013 007 054.5.

* cited by examiner

APPARATUS FOR LOW POWER WRITE AND READ OPERATIONS FOR RESISTIVE MEMORY

CLAIM OF PRIORITY

This application is a Divisional of, and claims the benefit of priority to U.S. patent application Ser. No. 16/052,552, filed Aug. 1, 2019, now issued as U.S. Pat. No. 10,438,640, on Oct. 8, 2019, which is a divisional of, and claims priority to U.S. patent application Ser. No. 14/129,277, filed Dec. 24, 2013, issued as U.S. Pat. No. 10,068,628 on Sep. 4, 2018, which is a National Phase Application of, and claims the benefit of priority to International Patent Application No. PCT/US2013/048753 filed Jun. 28, 2013, each titled "APPARATUS FOR LOW POWER WRITE AND READ OPERATIONS FOR RESISTIVE MEMORY," and which is incorporated by reference in its entirety.

BACKGROUND

On chip embedded memory with non-volatility can enable energy and computational efficiency. Several new types of solid-state, high-density, non-volatile memories store information using a memory element with a variable resistance. The resistance of spin transfer torque-magnetic random access memory (STT-MRAM) depends on the relative magnetization polarities of two magnetic layers. Other variable resistance memories include resistive RAM (ReRAM) and conductive bridging RAM (CbRAM), whose resistances depend on the formation and elimination of conduction paths through a dielectric or an electrolyte. There is also phase change memory (PCM), for which the resistivity of a cell depends on the crystalline or amorphous state of a chalcogenide.

FIG. 1 illustrates a two terminal 1T-1MTJ (Magnetic Tunnel Junction) bit-cell 100 for STT-MRAM. Bit-cell 100 includes an access transistor M1 and an MTJ device. The MTJ device is the storage element of STT-MRAM, which includes a pinned magnetic layer and a free magnetic layer. The free magnetic layer magnetization orientation can change with the write current direction. If the write current flows from the free magnetic layer to the pinned magnetic layer, the free magnetic layer magnetization aligns with the pinned magnetic layer and the MTJ device is in the parallel state ($R_P$) with low resistance. If the write current flows from the pinned magnetic layer to the free magnetic layer, the free magnetic layer magnetization direction opposes the pinned magnetic layer and the MTJ device is in the anti-parallel ($R_{AP}$) state with high resistance.

For these resistive memories, read operation is generally faster than write operation, and the write current is generally larger than the read current. Unlike SRAM (Static Random Access Memory) and DRAM (Dynamic Random Access Memory), which consume transient write power, resistive memory still consumes static write power whether or not the cell is flipped during write operation. The read power of these resistive memories may also be static depending on the implementation of the read sensor. Reducing read and write energies are a challenge for resistive memory in order to meet the targets for high performance and low power applications.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
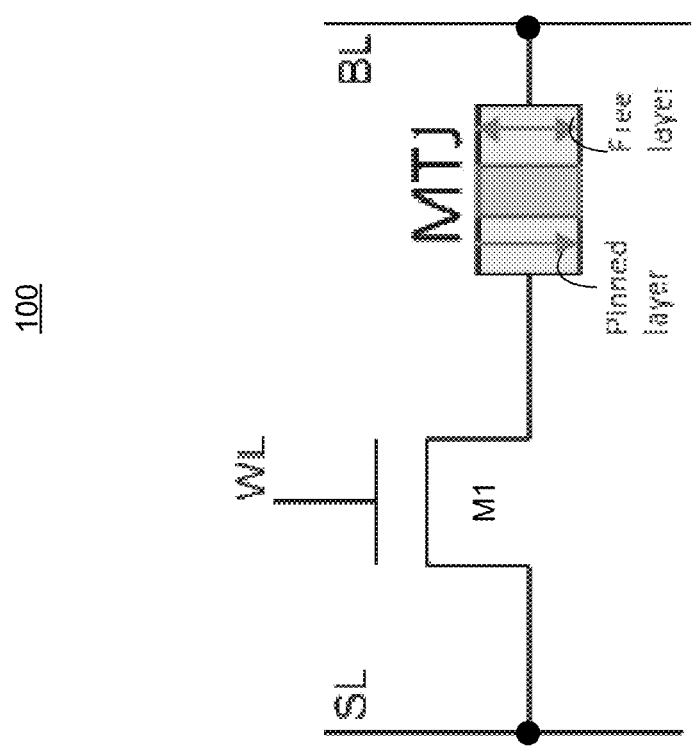
FIG. 1 illustrates a two terminal 1T-1MTJ bit-cell for STT-MRAM.

The embodiments describe write and read operation and design techniques for resistive memories to lower power consumption. In one embodiment, a data-driven write apparatus is used to lower power of write operation in resistive memories. In such an embodiment, asymmetric write switch current between Write0 and Write1 is used to lower power of write operation. For example, power savings in write operation between 25% and 37% of total write energy are realized by the apparatus.

In the following embodiments, the terms "Write0" refers to write operation to write a logical low to the memory element, and "Write1" refers to write operation to write a logical high to the memory element. In one embodiment, an apparatus is used to perform read operation before write operation. In such an embodiment, unnecessary writes are avoided by using an initial low-power read operation. Power savings, for example, in the range of 30%, may be realized when the read/write ratio is 50/50.

In one embodiment, an apparatus is provided to perform self-controlled write operation. In this embodiment, write operation is stopped as soon as the bit-cell flips i.e., the bit-cell which is selected for being written to. In one embodiment, an apparatus is provided to perform self-controlled read operation. In this embodiment, read operation is stopped as soon as data is detected. Power savings, for example, in the range of 10%-25%, in read power may be realized by the apparatus to perform self-controlled read operation.

Although the underlying memory element for resistive memory technologies varies, methods for reading and writing are electrically similar and are encompassed by embodiments. The embodiments can be combined to achieve the best energy savings for resistive memories.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
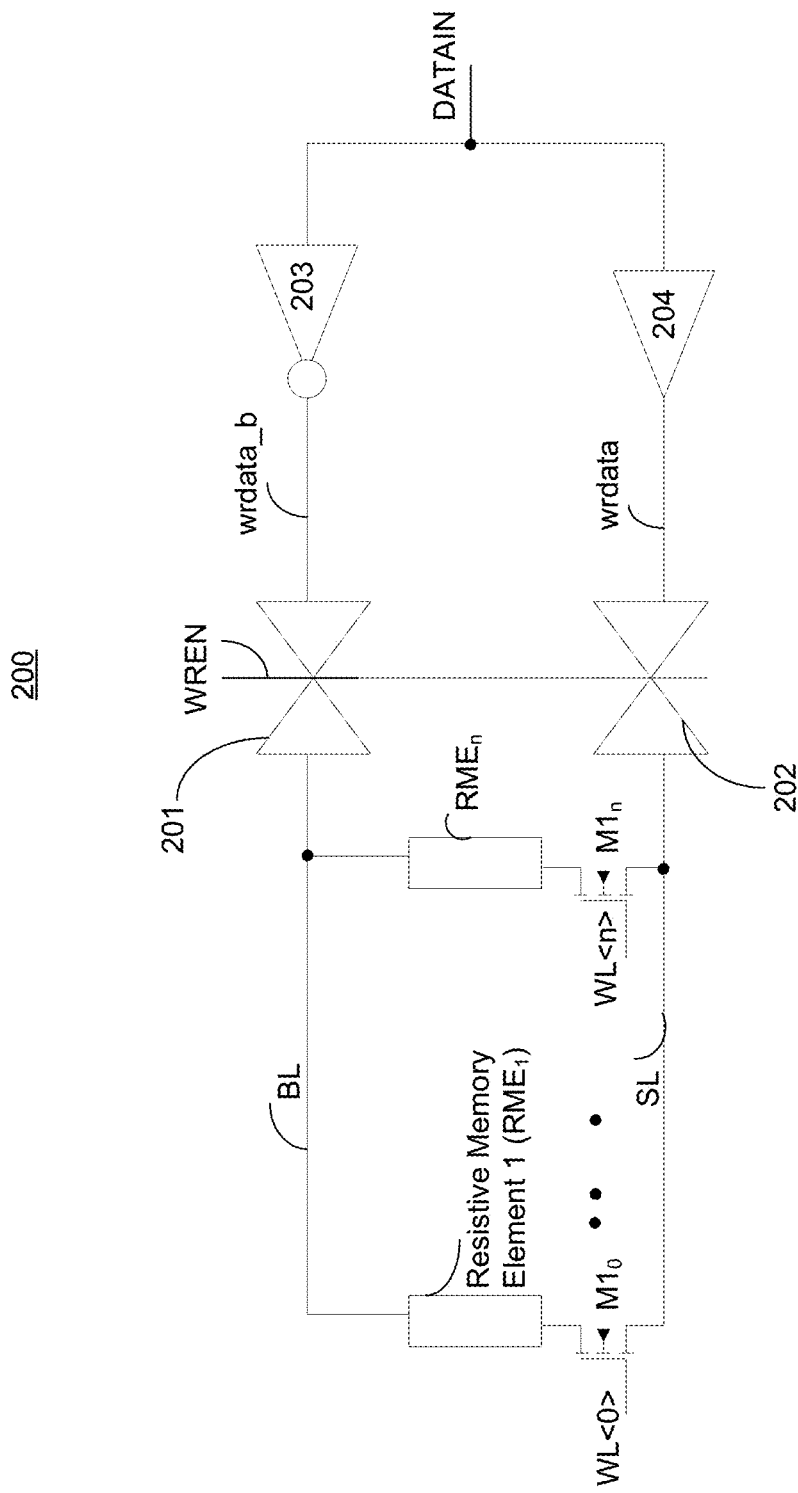
FIG. 2 is a conventional write path for a resistive memory.

FIG. 2 is a conventional write path 200 for a resistive memory. The write path 200 consists of write enable pass-gates 201 and 202, write drive buffers 203 and 204, and resistive memory elements coupled with their respective access (or select) transistors i.e., $RME_0$-$M1_0$ to $RME_n$-$M1_n$, where 'n' is an integer equal or greater than 1. Wordline (WL) is received by each transistor. For example, $M1_0$ receives WL<0>, and $M1_n$ receives WL<n>, where 'n' is an integer greater than zero. WREN (write enable) is used to control the pass-gates 201 and 202. One terminal of the bit-cell is coupled to bit line (BL) and the other end of the bit-cell is coupled to source or select line (SL). Write data DATAIN is received by write drivers 203 and 204 that generate wrdata_b and wrdata, where wrdata_b is inverse of wrdata. Depending on the logical level of WREN, wrdata_b and wrdata are coupled to BL and SL, respectively.

When WREN is high and DATAIN is also high, the current flow across the selected bit-cell switches it from the $R_P$ state to the $R_{AP}$ state (i.e., Write1). When WREN is high and DATAIN is low, the selected bit-cell switches from $R_{AP}$ to $R_P$ (i.e., Write0). The required write energies between the $R_{AP}$ and $R_P$ states are asymmetric i.e., the energy required to switch from $R_{AP}$ to $R_P$ (i.e., Write0) can be substantially smaller than the energy required to switch $R_P$ to $R_{AP}$ (i.e., Write1). The conventional design 200 always consumes the worst case energy for Write1, and this wastes energy during Write0.

Figure 3:
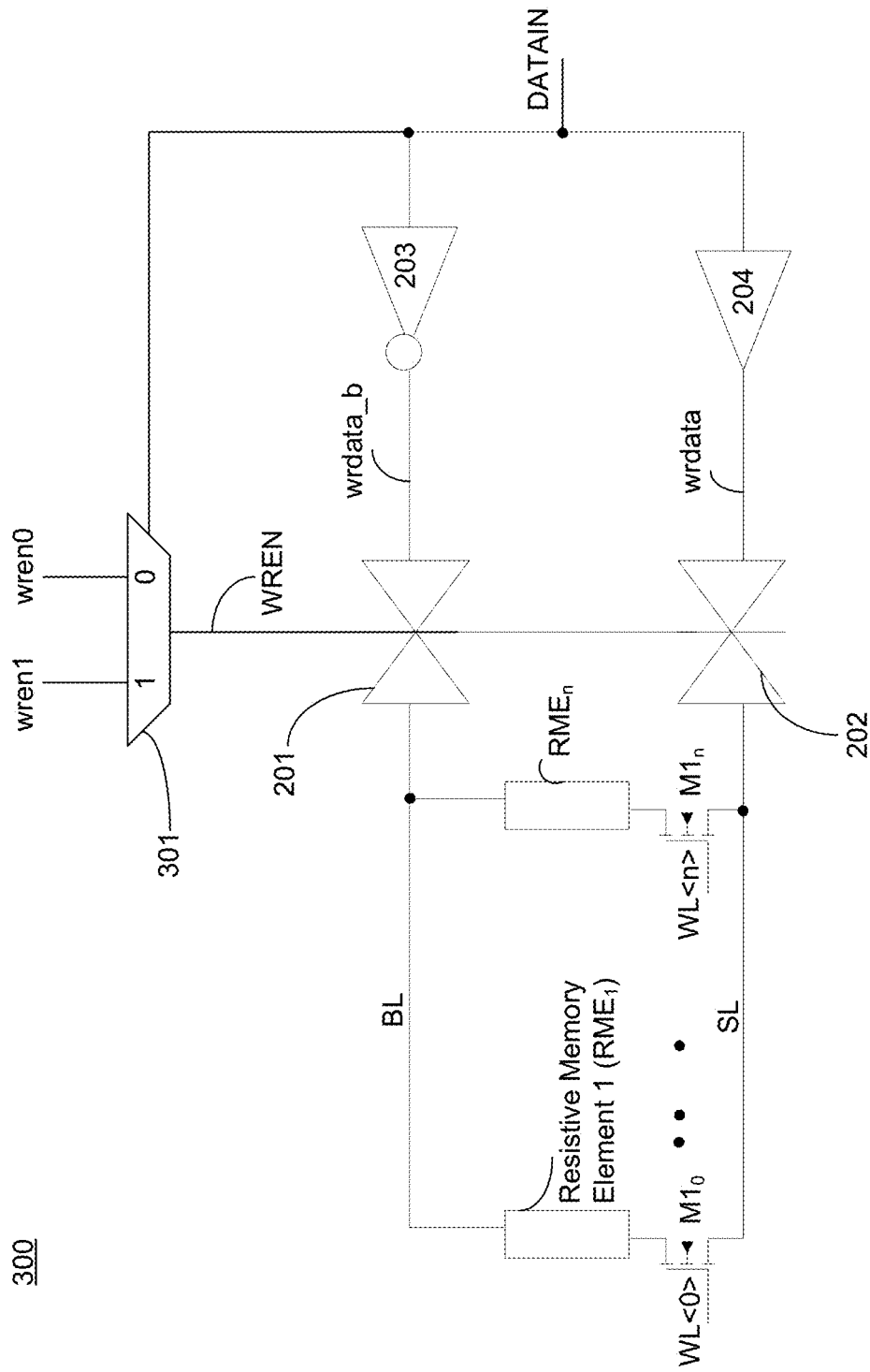
FIG. 3 is a data driven write path in time domain, according to one embodiment of the disclosure.

FIG. 3 is a data driven write path 300 in time domain, according to one embodiment of the disclosure. It is pointed out that those elements of FIG. 3 having the same reference numbers (or names) as the elements of any other figure can operate or function in any manner similar to that described, but are not limited to such.

For resistive memory, Write0 and Write1 switching energies are asymmetric. For example, the STT-MRAM switching energy from $R_{AP}$ to $R_P$ (i.e., Write0) can be substantially smaller than the switching energy from $R_P$ to $R_{AP}$ state (i.e., Write1). In addition, the source follower effect reduces the current seen by the cell for Write1 operation. Therefore, Write1 energy is much greater than the Write® energy. Existing designs (e.g., write path 200) expend the worst case write energy (i.e., the energy required for Write1) whether performing Write0 or Write1. This wastes energy during Write0 operation.

The embodiment of FIG. 3 uses a "data-driven write" technique to significantly reduce overall write energy. This can be done either in the time domain or in the current domain. In the time domain as discussed with reference to FIG. 3 and FIG. 4, a longer write pulse is applied for Write1 than for Write0, according to one embodiment. In the current domain as discussed with reference to FIG. 5 and FIG. 6, write time is fixed and a larger write current is sourced for Write1 than for Write0, according to one embodiment.

Referring to FIG. 3, in one embodiment, write path 300 comprises a selection unit 301 which is operable by DATAIN. In one embodiment, selection unit 301 is a multiplexer which receives at least two write enable signals—wren1 for enabling writing of a logical one, and wren0 for enabling writing of a logical zero to a selected bit-cell of the resistive memory. So as not to obscure the embodiments, elements and features discussed previously may not be repeated.

In one embodiment, data-driven write architecture 300 reduces energy in the time domain with a write-enable pulse. In one embodiment, wren1 is a pulse with longer pulse duration than pulse duration of wren0. In this embodiment, wren1 results in longer duration of write current and wren0 results in shorter duration of write current compared to one another. In one embodiment, for Write0 operation, DATAIN is low and wren0 is selected. In one embodiment, for Write1 operation, DATAIN is high and wren1 is selected. In one embodiment, pulse widths for wren1 and wren0 are programmable by software or hardware. In one embodiment, pulse widths for wren1 and wren0 are predetermined by fuses.

Figure 4:
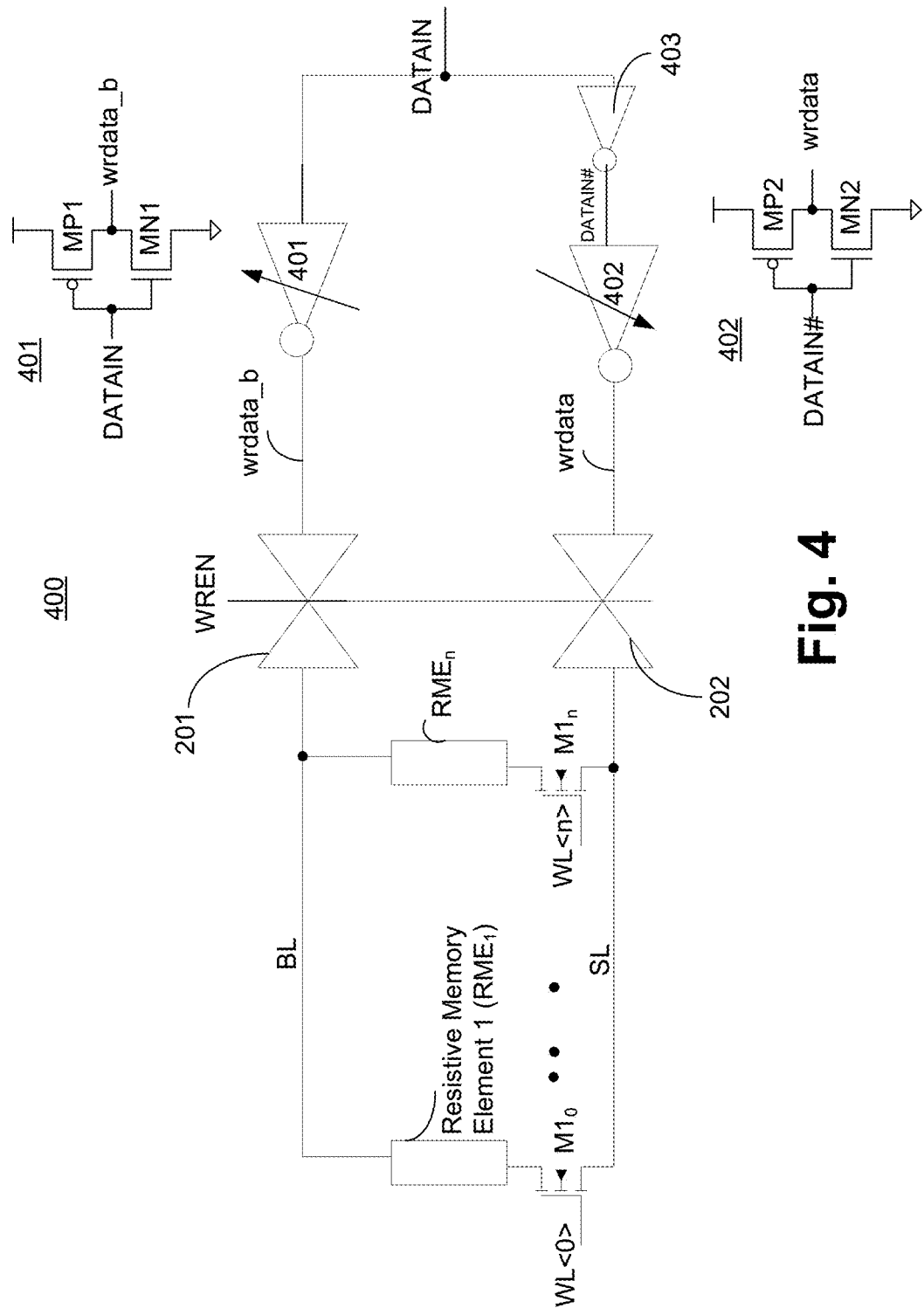
FIG. 4 is a data driven write path in current domain, according to one embodiment of the disclosure.

FIG. 4 is a data driven write path 400 in current domain, according to one embodiment of the disclosure. It is pointed out that those elements of FIG. 4 having the same reference numbers (or names) as the elements of any other figure can operate or function in any manner similar to that described, but are not limited to such.

In one embodiment, write data drivers 401 and 402 have skewed current drive strengths relative to one another. In one embodiment, write data drivers 401 and 402 comprises inverters at their driving ends. In one embodiment, devices (e.g., p-type device MP1, n-type device MN1, p-type device MP2, and n-type device MN2) in each write buffer are sized such that Write0 current is less than Write1 current. In one embodiment, MN1 and MP2 are made larger in size (i.e., W/L) for Write1 operation compared to traditional drivers 203 and 204 to provide more current for writing a logical one to a selected bit-cell compared to current for Write0. In one embodiment, MN2 and MP1 are made smaller in size (i.e., W/L) for Write0 operation compared to the same transistors in traditional drivers 203 and 204, to provide less current for writing a logical zero to a selected bit-cell compared to current for Write1.

In one embodiment, if the orientation of the resistive memory element (e.g., MJT) is changed or the positions of the MTJ and the access device are interchanged, the sizes for MP1, MN1, MP2, and MN2 in each write buffers are re-sized to accommodate for asymmetric power consumption by Write0 and Write1 e.g., Write0 current is less than Write1 current.

In one embodiment, adjustment to device sizes for write drivers 401 and 402 can be done dynamically (i.e., automatically) depending on DATAIN and DATAIN #. For example, when DATAIN is such that a logical zero is being written to a bit-cell, then the turn-on strengths of the devices MP1, MN1, MP2, and MN2 are adjusted i.e., MN2 and MP1 are made larger in size (i.e., W/L) compared to the same transistors in traditional drivers 203 and 204. In one embodiment, write data drivers 401 and 402 (plus preceding inverter 403) replace write data drivers 203 and 204, respectively, of write path architecture 200.

Figure 5:
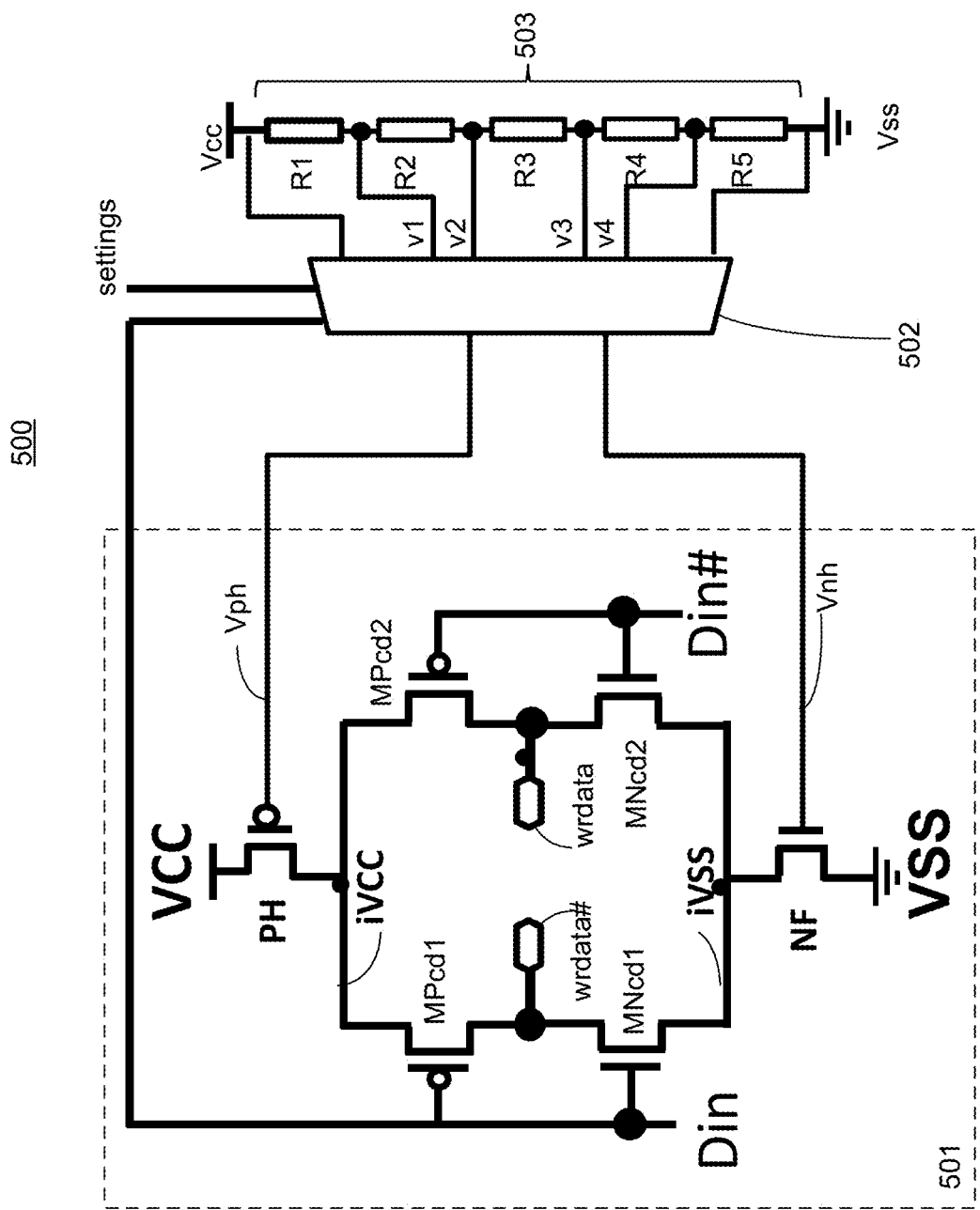
FIG. 5 is a variable strength write driver for a data driven write path in current domain, according to one embodiment of the disclosure.

FIG. 5 is a variable strength write driver 500 for a data driven write path in current domain, according to one embodiment of the disclosure. It is pointed out that those elements of FIG. 5 having the same reference numbers (or names) as the elements of any other figure can operate or function in any manner similar to that described, but are not limited to such.

In one embodiment, variable strength write driver 500 comprises a differential driver 501, selection unit 502, and reference generator 503. In one embodiment, differential driver 501 comprises a p-type current source PH with an adjustable current strength, n-type current source NF with an adjustable current strength, p-type devices MPcd1 and MPcd2, and n-type devices MNcd1 and MNcd2. In one embodiment, DATAIN (Din) is received by gate terminals of MPcd1 and MNcd1. In one embodiment, DATAIN # (Din # i.e., inverse of Din) is received by gate terminals of MPcd2 and MNcd2.

In one embodiment, MPcd1 and MNcd1 are coupled in series with a common node providing output i.e., wrdata_b (also referred to as wrdata #). In one embodiment, source terminal of MPcd1 is coupled to drain terminal (i.e., iVCC) of PH. In one embodiment, source terminal of MNcd1 is coupled to drain terminal (i.e., iVSS) of NF. In one embodiment, source terminal of PH is coupled to power supply VCC. In one embodiment, source terminal of NF is coupled to ground. In one embodiment, MPcd2 and MNcd2 are coupled in series with a common node providing output i.e., wrdata. In one embodiment, source terminal of MPcd2 is coupled to drain terminal (i.e., iVCC) of PH. In one embodiment, source terminal of MNcd2 is coupled to drain terminal (i.e., iVSS) of NF.

In one embodiment, DATAIN (i.e., Din) is used to determine bias voltages Vph for PH and/or Vnh for NF. In one embodiment, selection unit 502 is one or more multiplexers which receive a plurality of voltage references which are used to select bias voltage levels for Vph and/or Vnh in response to DATAIN and signal "settings." In one embodiment, selection unit 502 is an analog multiplexer which comprises pass gates. In one embodiment, selection unit 502 receives reference voltages e.g., Vcc, v1, v2, v3, v4, and Vss (i.e., ground), where v1 is less than Vcc but greater than v2, v2 is greater than v3, v3 is greater than v4, v4 is greater than Vss. While the embodiment illustrates references, Vcc, v1, v2, v3, v4, and Vss, fewer or more references can be received by selection unit 502.

In one embodiment, reference voltages e.g., Vcc, v1, v2, v3, v4, and Vss are generated by reference generator 503. In one embodiment, reference generator 503 is a voltage divider. In one embodiment, voltage divider comprises a series of resistors R1-R5 coupled together to form a voltage divider to generate bias voltages v1, v2, v3, and v4. In other embodiments, reference generator is any known reference generator e.g., bandgap reference generator, etc. Vph and Vnh are adjusted via DATAIN to achieve optimal write currents for Write0 and Write1 operations. In one embodiment, Vph varies between 0V to 0.5V. In one embodiment, Vnh varies between 1V to 0.5V.

In one embodiment, for a Write1, Din is set to Vcc and Din # is set to Vss. In one embodiment, a relatively stronger bias is applied at Vph and Vnh. For example, Vph may be set to Vss, and Vnh may be set Vcc. In such an embodiment, wrdata # is coupled to Vss through a relatively strong footer in device NF, and wrdata is coupled to Vcc through a relatively strong header in device PH. In such an embodiment, larger write current is generated.

In one embodiment, for Write0, Din is set to Vss and Din # is set to Vcc. In one embodiment, a relatively weaker bias is applied at Vph and Vnh. For example, Vph may be set to v3 and Vnh may be set v2. In such an embodiment, wrdata # is coupled to Vcc through a relatively weak header in device PH, and wrdata is coupled to Vss through a relatively weak footer in device NF. In such an embodiment, a smaller write current is generated. In one embodiment, the setting for multiplexer 502 may be adjusted on the fly (i.e., dynamically) if it is found that a particular design, post-manufacturing, can be written with weaker bias settings, and thus lower current and lower power for either Write0 or Write1 is realized. In one embodiment, selection by multiplexer 502 can made to match whichever write current is highest, for example, in the case that the MTJ is flipped or interchanged in position with the access device M1.

Existing designs use a write current magnitude and write time duration that meet the worst case scenario of the Write1 operation—regardless of whether they are performing Write0 or Write1. For any given application, the power savings for the "data-driven write" technique varies depending on the distribution of Write0 and Write1 operations. A typical usage case may be defined as one where Write0 and Write1 operations are equally likely and each occurs 50% of the time. In this case, the energy savings is 25% better than existing designs. For computer architectures and applications with Write0 more likely than Write1, the power savings improve. For example, if 75% of the total write operations are Write0 operations, then the write energy savings improves to 37%.

TABLE 1

Normalized write energy with different percentage of Write0 operation and different write time or write current ratio

| write time or write current ratio (wr0/wr1) | percentage of write 0 operation | | | | |
|---|---|---|---|---|---|
| | 0 | 25% | 50% | 75% | 100% |
| 0.25 | 1 | 0.81 | 0.63 | 0.44 | 0.25 |
| 0.5 | 1 | 0.88 | 0.75 | 0.63 | 0.50 |
| 0.75 | 1 | 0.94 | 0.88 | 0.81 | 0.75 |
| 1 | 1 | 1 | 1 | 1 | 1 |

Table 1 shows exemplary normalized write energy results for different percentages of Write0 operations and different write times or write current ratios for Write0 and Write1. When Write0 makes up 50% of total write operations, the energy savings from the embodiment of FIG. 5 is 25% better than a conventional design. For some computer architectures and applications, Write 0 is more likely than Write1, and the energy savings improves. For example, if Write0 operation occurs during 75% of total write operations, the energy savings is 37% from the embodiment of FIG. 5 compared to conventional design. In one embodiment, write data drivers 203 and 204 of write path architecture 200 are replaced with write driver 500.

Figure 6:
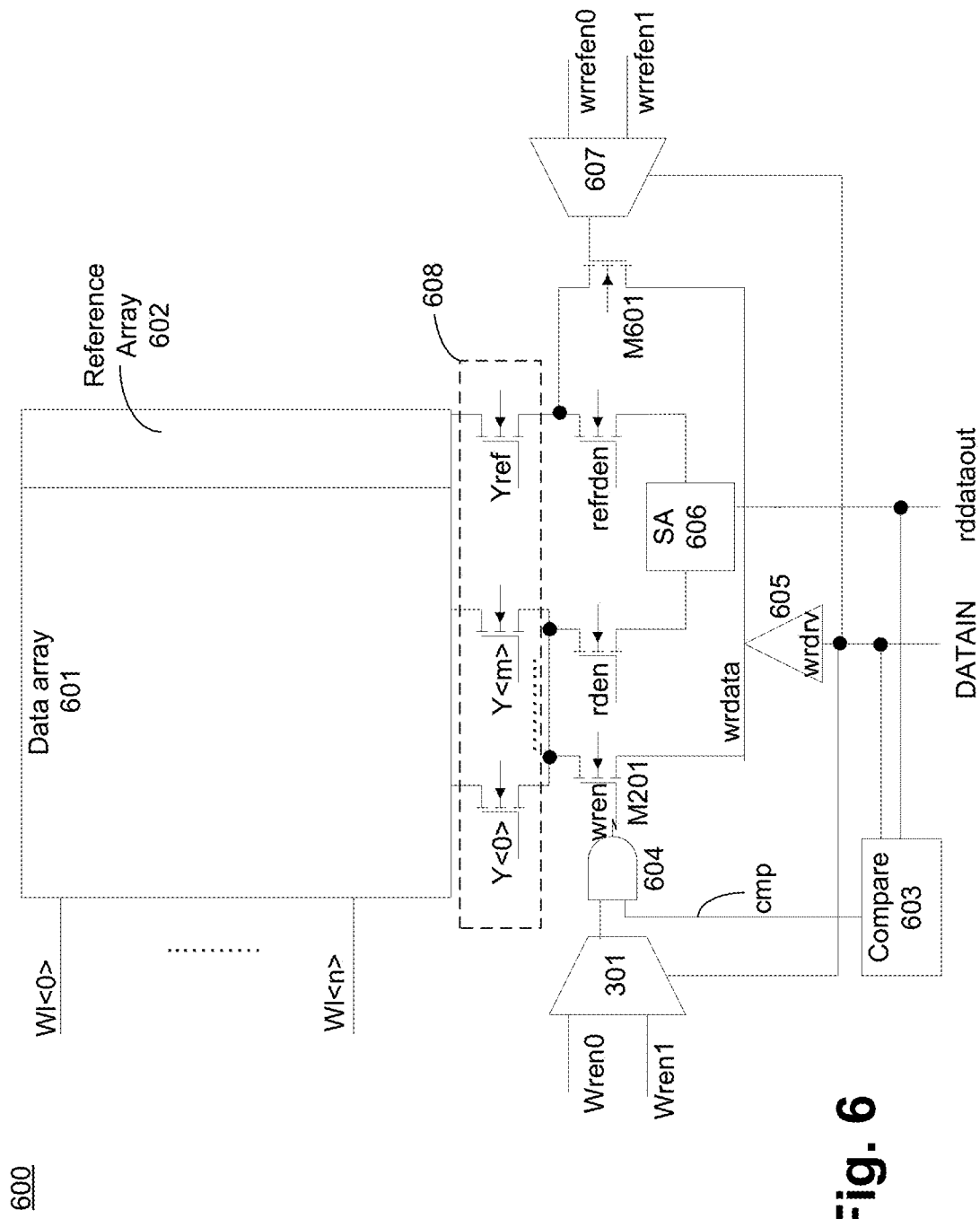
FIG. 6 is an array architecture that combines any or all embodiments of FIGS. 3-5 with logic to perform read operation before write operation, according to one embodiment of the disclosure.

FIG. 6 is an array architecture 600 that combines any or all embodiments of FIGS. 3-5 with logic to perform read operation before write operation, according to one embodiment of the disclosure. It is pointed out that those elements of FIG. 6 having the same reference numbers (or names) as the elements of any other figure can operate or function in any manner similar to that described, but are not limited to such.

For resistive memory, read time is much faster than the write time. Hence, read energy is much smaller than write energy. For example, read energy is about 5% of write energy for STT-MRAM in contemporary process technologies. In one embodiment, during each write operation, architecture 600 first reads data. For example, if the output read data is identical to the input write data, there is no need to waste energy with a write.

For resistive memory, read current is relatively small to avoid read disturbances, and read time is also typically much faster. Hence, the energy dissipated by read circuitry is much smaller than that dissipated during write. In addition, the time duration of a read operation is small compared with the time duration of a write operation. In one embodiment, during each write operation, data is read first with a small overhead in delay (e.g., 10%-20%) and energy (e.g., 5%). If the output read data is identical to the input write data, there is no need to waste time and energy on a write operation. The overall energy savings from skipping unnecessary write operations more than compensates for the small overhead incurred by the read operation.

The embodiments of "data driven write" of FIG. 5 and "read before write" of FIG. 6 can be combined to improve energy savings for resistive memories. Array architecture 600 is one embodiment that combines these techniques. Other techniques of FIGS. 3 and 4 can also be combined with the embodiment of FIG. 6.

In one embodiment, architecture 600 comprises data array 601, reference array 602, compare unit 603, logic gate 604, write driver 605 (wrdrv), sense amplifier (SA) 606, reference multiplexer 607, write enable multiplexer 301, column select unit 608, write enable pass-gate M201 (e.g., a transistor of pass-gate 201 of FIG. 2), reference enable pass-gate M601, read enable transistor controlled by rden, and reference read enable transistor controlled by refrden.

So as not to obscure the embodiments, a single transistor is used to represent multiplexors (e.g., 202) for illustration purposes. In one embodiment, wren0 and wren1 pulses are provided to multiplexer 301, and one of the pulses (according to the DATAIN) is applied to both data array 601 and reference array 602. For reference write, a single wren0/1 signal is selected based on DATAIN.

In one embodiment, during read portion of the operation, both rden and refrden cause their respective transistors to be turned on. In such an embodiment, rddataout is generated through SA circuit 606. In one embodiment, during data write operation, the read portion of the operation is performed first, and rddataout is compared with DATAIN by compare unit 603. In one embodiment, compare unit 603 comprises an exclusive-OR (XOR) logic. In other embodiments, other logic units may be used to implement compare unit 603. In one embodiment, when rddataout and DATAIN match, output "cmp" of compare unit 603 is '0', wren is "0" and no write operation is needed. In this embodiment, wren0 and wren1 are not 0. In one embodiment, when rddataout and DATAIN do not match, output cmp of compare unit 603 is '1,' and one of wren0/1 is selected depending on the polarity of DATAIN.

While the embodiment combines the apparatus of FIG. 3, architecture 600 may only have the apparatus needed for performing read operation before write operation. In one embodiment, architecture 600 combines (in any combination) all the embodiments discussed.

Figure 7:
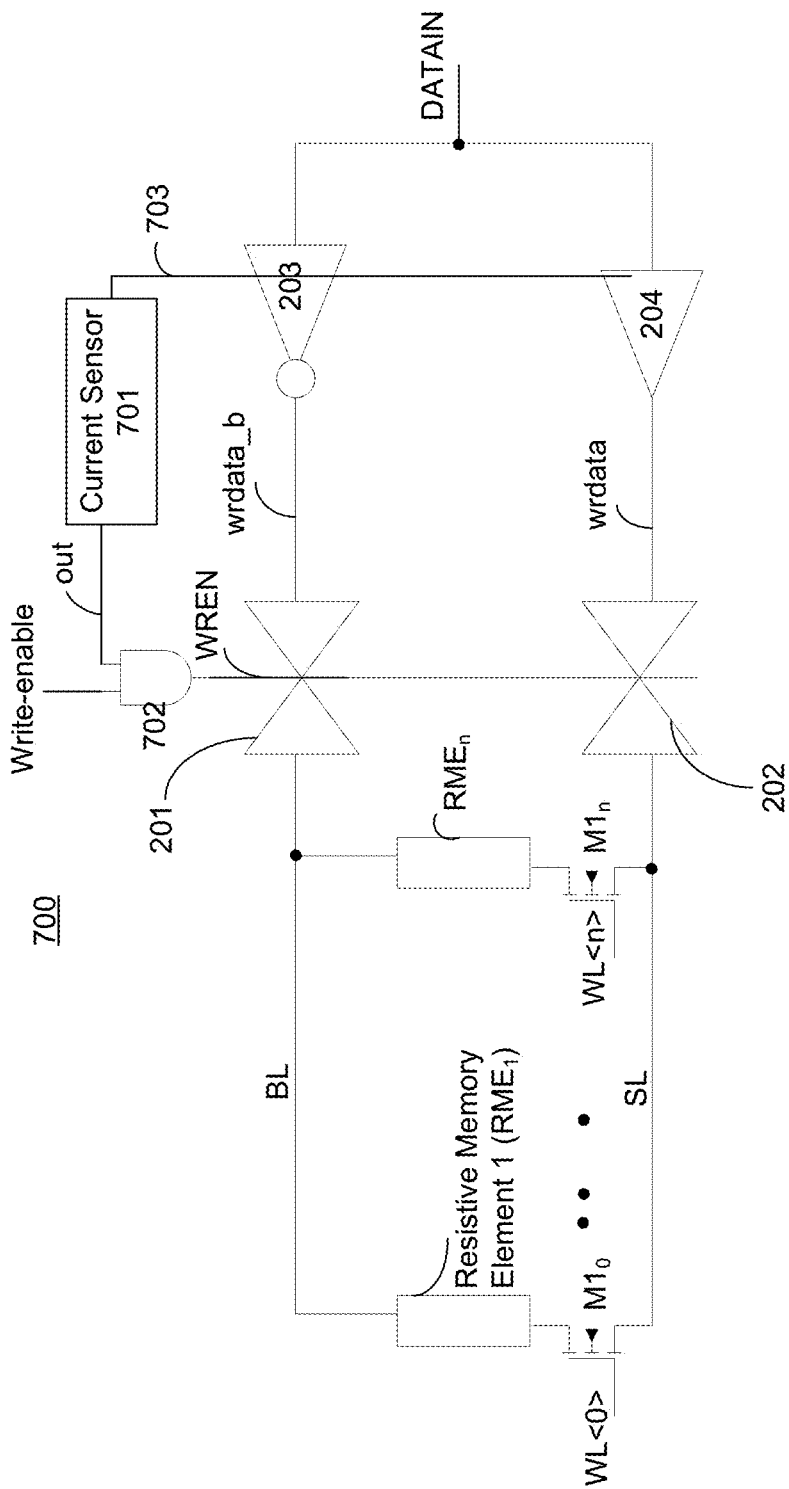
FIG. 7 is a write path architecture with self-controlled write operation, according to one embodiment of the disclosure.

FIG. 7 is a write path architecture 700 with self-controlled write operation, according to one embodiment of the disclosure. It is pointed out that those elements of FIG. 7 having the same reference numbers (or names) as the elements of any other figure can operate or function in any manner similar to that described, but are not limited to such.

In one embodiment whether performing Write1 or Write0, the write time for any given bit-cell at any given time follows a distribution such that some bit-cells take longer to write than other bit-cells. Existing designs source a current through the memory element for a time duration that guarantees writing cells with write times well above the mean, regardless of the actual time necessary to write that particular cell. For example, in an MTJ memory element in contemporary process technologies, a nominal write time of 10 ns ensures a successful write for cells with a 5-sigma write time. With a self-controlled write implemented by write path architecture 700, the aggregate write time is reduced to the time that it actually takes to write an average bit-cell. This reduction in write time translates to a reduction in the amount of time that current flows and, hence, a reduction in power consumption.

In one embodiment, write path architecture 700 comprises a current sensor 701 and logic unit 702. So as not to obscure the embodiments, elements/features previously discussed are not repeated. In one embodiment, current sensor 701 senses current via sense line 703 of write drivers 203 and/or 204 to determine whether write drivers are writing the same data or different data i.e., the current through write drivers 203, 204, and the memory cell should all be the same since they are coupled together in series. For example, write path architecture 700 monitors the bit-cell current (via write drivers 203 and/or 204) to detect any change due to a resistance change in the memory element.

If the bit-cell current changes significantly, it means that the bit-cell has flipped and the write operation can be stopped. Upon a significant increase or decrease in current, current sensor 701 block outputs a '0' that disables the write pass-gates 201 and 202. For example, resistance of MTJ may change by 2× when switching states; it should be at least ½ the total resistance in the whole path (write driver 204→write pass-gate 202→access device M1→MTJ→write pass-gate 201→write driver 203), so in this example "significant" would be a change of 25% in the current magnitude.

In one embodiment, write pass-gates 201 and 202 are blocked via logic gate 702 if current sensor 701 indicates that write operation has been performed. In one embodiment, logic gate 702 is an AND gate. In another embodiment, logic gate 702 is a NAND gate. In other embodiments, other logic gates may be used to perform the function described. In one embodiment, write path architecture 700 avoids wasting power for bit-cells that flip before the worst-case 5-sigma cell, and it provides a complementary power savings method when used with other embodiments. In such an embodiment, the self-controlled write scheme reduces the aggregate write power dissipation. In one embodiment, architecture 700 combines (in any combination) all the embodiments discussed.

Figure 8:
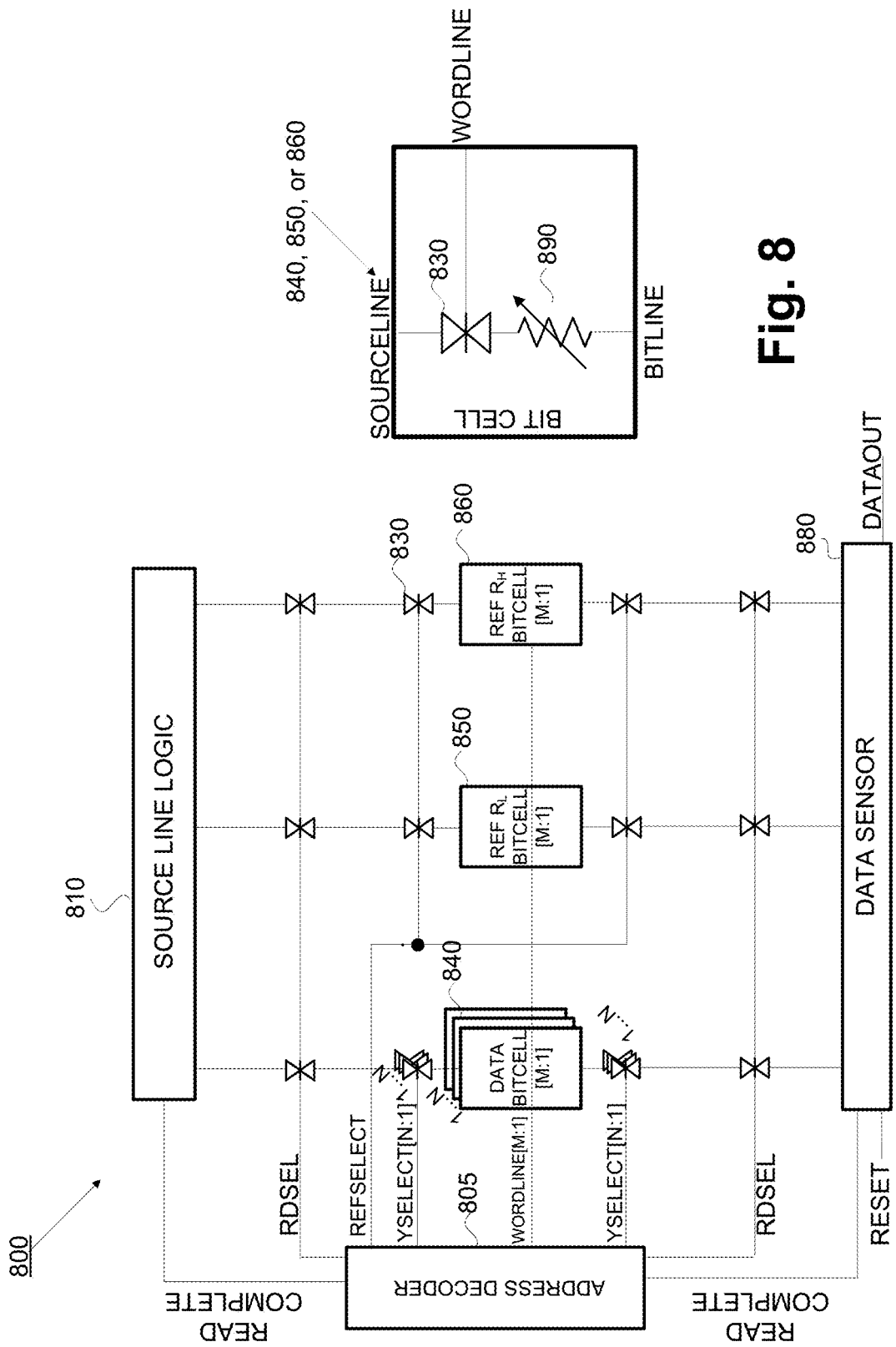
FIG. 8 is a read path architecture with self-controlled read operation, according to one embodiment of the disclosure.

FIG. 8 is a read path architecture 800 with self-controlled read operation, according to one embodiment of the disclosure. It is pointed out that those elements of FIG. 8 having the same reference numbers (or names) as the elements of any other figure can operate or function in any manner similar to that described, but are not limited to such.

During a read operation (whether sensing current, voltage, or RC (resistor-capacitor) time constants, current flows across the memory element. Although the total read energy is generally less than the total write energy, read energy still has a significant and application-dependent impact on the system power consumption. Reducing read energy may also save write energy when using the "read before write" approach described with reference to FIG. 8. For the self-controlled read, read path architecture 800 implements a "read complete" function in the sensing element. This output stops the flow of current during the present read operation.

In one embodiment, when reading, the time needed to resolve the state of any given cell on any given chip may take longer or shorter than other cells on other chips. Existing designs source a current through the memory element for a time duration that guarantees a successful read for cells and sensors with read times well above the mean—regardless of the actual time necessary for a particular sensor to read a particular cell. For example, in an MTJ memory element in contemporary process technologies, current flows for up to 2 ns in order to successfully read cells and sensors with a 6-sigma read time. A self-controlled read as described by the embodiment of read path architecture 800 reduces the aggregate read time down to the read time for an average cell and sensor. This translates to a reduction in the amount of time that current flows during read and, hence, a reduction in power consumption.

Read time is usually determined by a 5-sigma cell, however, the average read time is smaller. Self-controlled read, as described by the embodiment read path architecture 800, allows for a shorter read time in the aggregate than with the usual method of using 5-sigma read time for all cells.

A memory array comprises M-rows and N-columns of data bit-cells 840, each with a resistive memory element 890 that assumes either a lower resistance state with resistance $R_L$ or a higher resistance state with resistance $R_H$. For every N columns of data bit cells 840, there is a single M-row column of reference bit-cells fixed to the lower resistance state 850 and a single M-row column of reference bit-cells fixed to the higher resistance state 860. During a read operation, decoder 805 selects one row and one column of the memory array to address a single data bit-cell 840: the YSELECT signal selects the column, and the WORDLINE signal selects the row.

Likewise, for the reference bit-cells 850/860, the WORDLINE selects the same row as the data cell 840, and the REFSELECT signal selects both reference columns. The RDSEL signal enables read operation for both the reference and data columns. Selection activates access devices 830 that electrically connect the sourceline logic 810 to the data sensor 880 on the BITLINE. The access device 830 may be an NMOS transistor, a PMOS transistor, or a CMOS pass-gate.

Figures 9A, 9B:
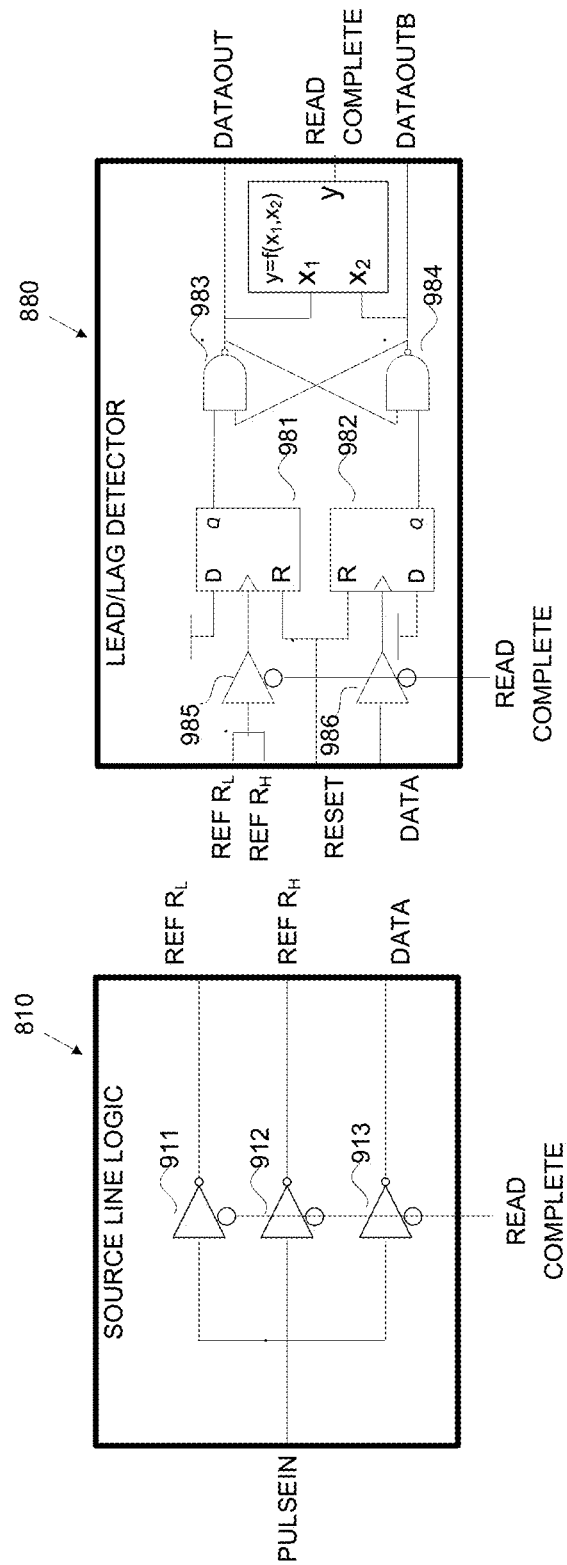
FIG. 9A is a source line logic for the read path architecture with self-controlled read operation, according to one embodiment of the disclosure.
FIG. 9B is a lead/lag detector for the read path architecture with self-controlled read operation, according to one embodiment of the disclosure.

FIG. 9A are pulse drivers for source line logic 810 for the read path architecture 800 with self-controlled read operation, according to one embodiment of the disclosure. FIG. 9B is a time domain lead/lag detector (or data sensor) 880 for the read path architecture 800 with self-controlled read operation, according to one embodiment of the disclosure.

It is pointed out that those elements of FIGS. 9A-B having the same reference numbers (or names) as the elements of any other figure can operate or function in any manner similar to that described, but are not limited to such.

In one embodiment, sourceline logic 810 comprises three buffers 911-913 that each sends a pulse through the data column and the reference columns. For a data cell 840 in the $R_H$ ($R_{AP}$) state, the pulse will encounter a longer RC delay than the delay through the parallel combination of the reference columns. Similarly, for a data cell 840 in the $R_L$ ($R_P$) state, the pulse will encounter a shorter RC delay than the delay through the parallel combination of the reference columns. In one embodiment, to detect the state of the data cell, the data sensor 880 senses the position in time of the data pulse relative to the reference pulse. In one embodiment, the lead/lag detector 880 comprises high-gain D flip-flops on the REFERENCE 981 and DATA 982 paths followed by high-gain cross-coupled NAND gates on the REFERENCE 983 and DATA 984 paths.

In one embodiment, after RESET, the flip-flops preserve the order of the rising edges of the DATA and REFERENCE pulses and prevent the falling edges from disturbing the DATAOUT output. In one embodiment, if a REFERENCE edge arrives first, the cross-coupled NAND gates latch a data '0' on the DATAOUT signal until RESET. In one embodiment, if a DATA edge arrives first, the cross-coupled NAND gates latch a data '1' on the DATAOUT signal until RESET. In one embodiment, when either DATAOUT or DATAOUTB rises, there is no longer a need to induce current through the data 840 and reference cells 850/860.

The activation of the READ COMPLETE signal is a logical function (such as "exclusive-OR (XOR)") of the DATAOUT and DATAOUTB signals. In one embodiment, READ COMPLETE is used as a DFT (Design-For-Test) feature to confirm that the sensor actually fired, instead of the sensor's initial DATAOUT state just happening to be the same as the read data. In one embodiment, the READ COMPLETE signal can then disconnect the SOURCELINE from the BITLINE by disabling the access devices 830. This stops current from flowing through the data cell 840 and the reference cells 850/860. In one embodiment, the READ COMPLETE signal can also tri-state the pulse driver in the SOURCELINE logic 810 and disable the input buffers 985/986 on the flip-flops 981/982 in the lead/lag detector 880. This prevents any crowbar current flow in these blocks.

Figure 10:
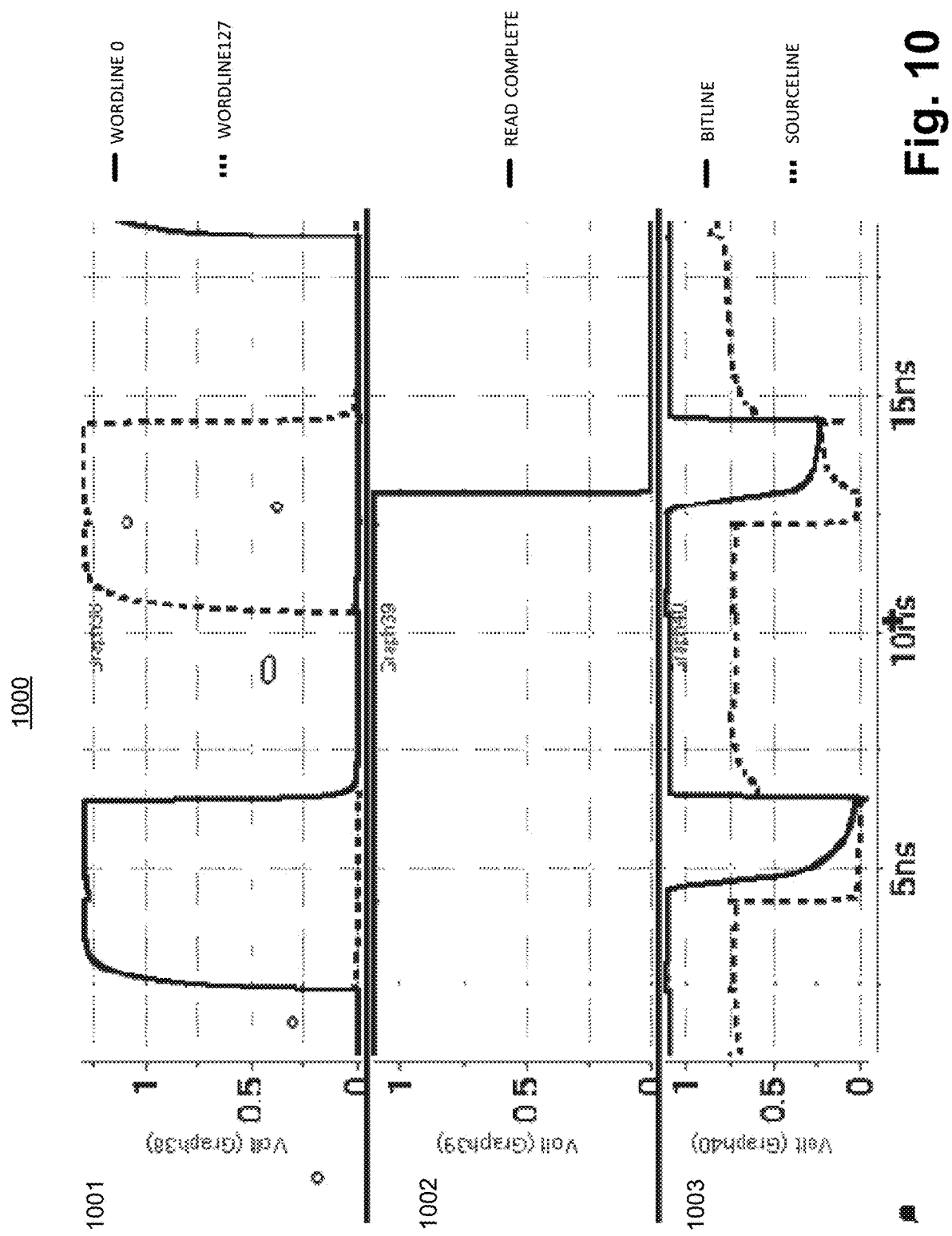
FIG. 10 is a plot showing operation of the read path architecture with self-controlled read operation, according to one embodiment of the disclosure.

FIG. 10 is a plot 1000 showing operation of the read path architecture 800 with self-controlled read operation, according to one embodiment of the disclosure. It is pointed out that those elements of FIG. 10 having the same reference numbers (or names) as the elements of any other figure can operate or function in any manner similar to that described, but are not limited to such.

The first read in plot 1001 from 2 ns to 10 ns is a baseline read without the embodiment of FIG. 8, and the second read in plot 1001 from 10 ns to 18 ns uses a self-controlled read of FIG. 8 to save read power. The READ COMPLETE signal is implemented as a logical Exclusive-OR (XOR) function of DATAOUT and DATAOUTB. The READ COMPLETE signal shown in plot 1002 tri-states the SOURCELINE LOGIC drivers 911-913 and the LEAD/LAG input buffers 985/986, and it electrically disconnects the SOURCELINE from the BITLINE by disabling the RDEN signal as shown in plot 1003.

This saves power. For example, it stops any crowbar current in the SOURCE LINE LOGIC drivers 911-913 and in the LEAD/LAG input buffers 985/986; the BITLINE is not discharged fully to Vss so the subsequent pre-charge uses less power; and the RDEN multiplexer (or pass-gate) prevents current from flowing across the memory element when the SOURCELINE and BITLINE are at different potentials. In one embodiment, architecture 800 combines (in any combination) all the embodiments discussed.

Figure 11:
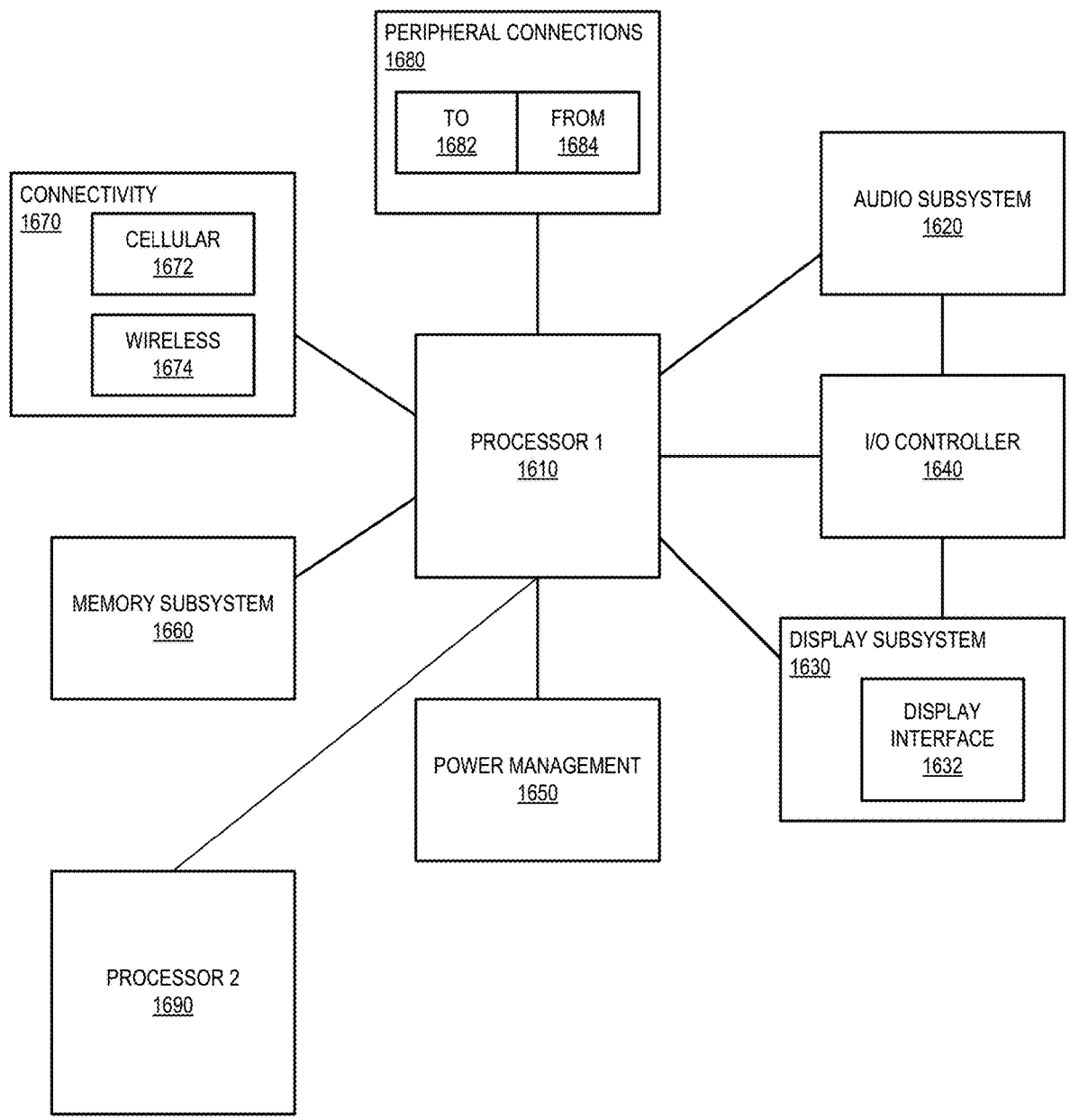
FIG. 11 is a smart device or a computer system or an SoC (system-on-chip) with any of the read and write design architectures described with reference to FIGS. 3-10, according to one embodiment of the disclosure.

FIG. 11 is a smart device or a computer system or an SoC (system-on-chip) with any of the read and write design architectures described with reference to FIGS. 3-10, according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with any of the read and write design architectures described with reference to embodiments of FIGS. 3-10, according to the embodiments discussed. Other blocks of the computing device 1600 may also include any of the read and write design architectures described with reference to embodiments of FIGS. 3-10. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a resistive memory cell coupled to a bit line and a select line;

a first pass-gate coupled to the bit line; a second pass-gate coupled to the select line; and a multiplexer operable by input data, the multiplexer to provide a control signal to the first and second pass-gates according to logic level of the input data. In one embodiment, the multiplexer to receive at least two inputs of different pulse widths. In one embodiment, apparatus further comprises logic to adjust pulse widths of the at least two inputs. In one embodiment, the at least two inputs are first and second write enable pulses, the first write enable pulse for controlling duration of writing a logical high to the resistive memory, and the second write enable pulse for controlling duration of writing a logical low to the resistive memory.

In one embodiment, the resistive memory is at least one of: STT-MRAM; ReRAM; or CBRAM. In one embodiment, the apparatus further comprises: a first write driver to drive input data to the first pass-gate; and a second write driver to drive an inverse of the input data to the second pass-gate. In one embodiment, the resistive memory is an STT-MRAM bit-cell which comprises: a select transistor controllable by a word line; and a magnetic tunnel junction (MTJ) device coupled in series with the select transistor.

In another example, an apparatus comprises: a resistive memory cell coupled to a bit line and a select line; a first pass-gate coupled to the bit line; a second pass-gate coupled to the select line; a first write driver to drive an input data to the first pass-gate, the first write driver having a first drive skew; and a second write driver to drive an inverse of the input data to the second pass-gate, the second write driver having a second drive skew, wherein the first drive skew is different than the second drive skew.

In one embodiment, the apparatus further comprises logic to adjust first and second drive skews of the first and second write drivers. In one embodiment, the logic to dynamically adjust first and second drive skews of the first and second write drivers according to the input data. In one embodiment, the apparatus further comprises: a multiplexer operable by the input data, the multiplexer to provide a control signal to the first and second pass-gates according to logic level of the input data. In one embodiment, the multiplexer receives at least two inputs of different pulse widths. In one embodiment, the apparatus further comprises logic to adjust pulse widths of the at least two inputs.

In one embodiment, the at least two inputs are first and second write enable pulses, the first write enable pulse for controlling duration of writing a logical high to the resistive memory, the second write enable pulse for controlling duration of writing a logical low to the resistive memory. In one embodiment, the resistive memory is at least one of: STT-MRAM; ReRAM; PCM; or CBRAM. In one embodiment, the resistive memory is an STT-MRAM bit-cell which comprises: a select transistor controllable by a word line; and a magnetic tunnel junction (MTJ) device coupled in series with the select transistor.

In another example, in one embodiment, an apparatus comprises: a resistive memory cell coupled to a bit line and a select line; a first pass-gate coupled to the bit line; a second pass-gate coupled to the select line; and a differential write driver to receive a differential input and to drive a differential output to the first and second pass-gates, wherein the differential write driver to cause a first output of the differential output to have a different drive strength than a second output of the differential output. In one embodiment, the differential write driver comprises an adjustable p-type current source.

In one embodiment, the apparatus further comprises a variable voltage generator to provide a bias for the adjustable p-type current source according to the first or second outputs or both. In one embodiment, the differential write driver comprises an adjustable n-type current source. In one embodiment, the apparatus further comprises a variable voltage generator to provide a bias for the adjustable n-type current source according to the first or second outputs or both. In one embodiment, the variable voltage generator comprises: a multiplexer controllable by the first or second outputs or both; and a voltage divider to provide a plurality of voltages of different levels to the multiplexer.

In one embodiment, the apparatus further comprises a multiplexer operable by the input data, the multiplexer to provide a control signal to the first and second pass-gates according to logic level of the input data. In one embodiment, the multiplexer to receive at least two inputs of different pulse widths. In one embodiment, the apparatus further comprises logic to adjust pulse widths of the at least two inputs. In one embodiment, the at least two inputs are first and second write enable pulses, the first write enable pulse for controlling duration of writing a logical high to the resistive memory, and the second write enable pulse for controlling duration of writing a logical low to the resistive memory. In one embodiment, the resistive memory is at least one of: STT-MRAM; ReRAM; PCM; or CBRAM. In one embodiment, the resistive memory is an STT-MRAM bit-cell which comprises: a select transistor controllable by a word line; and a magnetic tunnel junction (MTJ) device coupled in series with the select transistor.

In another example, in one embodiment, a resistive memory cell; a comparator to compare read data and write data, and to generate an output indicating whether read data is same as write data; and logic to receive output from the comparator, the logic to generate a write enable for controlling a pass-gate coupled directly or indirectly to the resistive memory cell. In one embodiment, the logic to enable write operation if the output of the comparator indicates that the read data is different from the write data. In one embodiment, the logic to disable write operation if the output of the comparator indicates that the read data is same as the write data.

In one embodiment, the apparatus further comprises logic to cause read operation before write operation. In one embodiment, the pass-gate is coupled to a bit line which is coupled to the resistive memory, wherein the pass-gate is a first pass gate, and wherein the apparatus further comprises: a second pass-gate coupled to a select line which is coupled to the resistive memory; and a differential write driver to receive a differential input and to drive a differential output to the first and second pass-gates, wherein the differential write driver to cause a first output of the differential output to have a different drive strength than a second output of the differential output.

In one embodiment, the apparatus further comprises: a multiplexer operable by the input data, the multiplexer to provide a control signal to the logic unit according to logic level of the write data. In one embodiment, the multiplexer to receive at least two inputs of different pulse widths. In one embodiment, the apparatus further comprises logic to adjust pulse widths of the at least two inputs. In one embodiment, the at least two inputs are first and second write enable pulses, the first write enable pulse for controlling duration of writing a logical high to the resistive memory, and the second write enable pulse for controlling duration of writing a logical low to the resistive memory.

In one embodiment, the pass-gate is coupled to a bit line which is coupled to the resistive memory, wherein the pass-gate is a first pass gate, and wherein the apparatus further comprises: a second pass-gate coupled to a select line which is coupled to the resistive memory; a first write driver to drive an input data to the first pass-gate, the first write driver having a first drive skew; and a second write driver to drive an inverse of the input data to the second pass-gate, the second write driver having a second drive skew, wherein the first drive skew is different than the second drive skew.

In one embodiment, the apparatus further comprises logic to adjust first and second drive skews of the first and second write drivers. In one embodiment, the logic to dynamically adjust first and second drive skews of the first and second write drivers according to the input data. In one embodiment, the pass-gate is coupled to a bit line which is coupled to the resistive memory, wherein the pass-gate is a first pass gate, and wherein the apparatus further comprises: a second pass-gate coupled to a select line which is coupled to the resistive memory; and a differential write driver to receive a differential input and to drive a differential output to the first and second pass-gates, wherein the differential write driver to cause a first output of the differential output to have a different drive strength than a second output of the differential output.

In one embodiment, the differential write driver comprises an adjustable p-type current source. In one embodiment, the apparatus further comprises a variable voltage generator to provide a bias for the adjustable p-type current source according to the first or second outputs or both. In one embodiment, the differential write driver comprises an adjustable n-type current source. In one embodiment, the apparatus further comprises a variable voltage generator to provide a bias for the adjustable n-type current source according to the first or second outputs or both.

In one embodiment, the variable voltage generator comprises: a multiplexer controllable by the first or second outputs or both; and a voltage divider to provide a plurality of voltages of different levels to the multiplexer. In one embodiment, the resistive memory is at least one of: STT-MRAM; ReRAM; PCM; or CBRAM. In one embodiment, the resistive memory is an STT-MRAM bit-cell which comprises: a select transistor controllable by a word line; and a magnetic tunnel junction (MTJ) device coupled in series with the select transistor.

In another example, an apparatus comprises: a resistive memory cell; a write driver to receive input data for writing to the resistive memory cell; a current sensor to sense current in the write driver; and logic to receive output from the current sensor, the logic to generate a write enable for controlling a pass-gate coupled directly or indirectly to the resistive memory cell. In one embodiment, the logic to enable write operation if the output of the current sensor indicates that a write current change is within a threshold.

In one embodiment, the logic to disable write operation if the output of the current sensor indicates that a write current change is above a threshold. In one embodiment, the apparatus further comprises: a comparator to compare read data and write data, and to generate an output indicating whether read data is same as write data, wherein the input data is the same as write data; and logic to receive output from the comparator, the logic to generate a write enable for controlling a pass-gate coupled directly or indirectly to the resistive memory cell.

In one embodiment, the logic to enable write operation if the output of the comparator indicates that the read data is different from the write data. In one embodiment, the logic to disable write operation if the output of the comparator indicates that the read data is the same as the write data. In one embodiment, the apparatus further comprises logic to cause read operation before write operation.

In one embodiment, the apparatus further comprises a pass-gate coupled to a bit line which is coupled to the resistive memory, wherein the pass-gate is a first pass gate, and wherein the apparatus further comprises: a second pass-gate coupled to a select line which is coupled to the resistive memory; and a differential write driver to receive a differential input and to drive a differential output to the first and second pass-gates, wherein the differential write driver to cause a first output of the differential output to have a different drive strength than a second output of the differential output.

In one embodiment, the apparatus further comprises: a multiplexer operable by the input data, the multiplexer to provide a control signal to the logic unit according to logic level of the write data. In one embodiment, the multiplexer to receive at least two inputs of different pulse widths. In one embodiment, the apparatus further comprises logic to adjust pulse widths of the at least two inputs. In one embodiment, the at least two inputs are first and second write enable pulses, the first write enable pulse for controlling duration of writing a logical high to the resistive memory, and the second write enable pulse for controlling duration of writing a logical low to the resistive memory.

In one embodiment, the apparatus further comprises a pass-gate coupled to a bit line which is coupled to the resistive memory, wherein the pass-gate is a first pass gate, and wherein the apparatus further comprises: a second pass-gate coupled to a select line which is coupled to the resistive memory; a first write driver to drive an input data to the first pass-gate, the first write driver having a first drive skew; and a second write driver to drive an inverse of the input data to the second pass-gate, the second write driver having a second drive skew, wherein the first drive skew is different than the second drive skew.

In one embodiment, the apparatus further comprises logic to adjust first and second drive skews of the first and second write drivers. In one embodiment, the logic to dynamically adjust first and second drive skews of the first and second write drivers according to the input data. In one embodiment, the apparatus further comprises a pass-gate coupled to a bit line which is coupled to the resistive memory, wherein the pass-gate is a first pass gate, and wherein the apparatus further comprises: a second pass-gate coupled to a select line which is coupled to the resistive memory; and a differential write driver to receive a differential input and to drive a differential output to the first and second pass-gates, wherein the differential write driver to cause a first output of the differential output to have a different drive strength than a second output of the differential output.

In one embodiment, the differential write driver comprises an adjustable p-type current source. In one embodiment, the apparatus further comprises a variable voltage generator to provide a bias for the adjustable p-type current source according to the first or second outputs or both. In one embodiment, wherein the differential write driver comprises an adjustable n-type current source. In one embodiment, the apparatus further comprises a variable voltage generator to provide a bias for the adjustable n-type current source according to the first or second outputs or both.

In one embodiment, the variable voltage generator comprises: a multiplexer controllable by the first or second outputs or both; and a voltage divider to provide a plurality of voltages of different levels to the multiplexer. In one embodiment, the resistive memory is at least one of: STT-MRAM; ReRAM; PCM; or CBRAM. In one embodiment, the resistive memory is an STT-MRAM bit-cell which comprises: a select transistor controllable by a word line; and a magnetic tunnel junction (MTJ) device coupled in series with the select transistor.

In another example, in one embodiment, an apparatus comprises: an array of resistive memory cells for containing data; reference resistive memory bit-cells; a detector for comparing data read from a reference bit-cell, from among the reference resistive memory bit-cells, and data read a resistive memory cell from the array of resistive memory cells; and logic to disable read operation when output of detector indicates that data has been read from the resistive memory cell from the array of resistive memory cells.

In one embodiment, the logic to further disable the detector when output of detector indicates that data has been read from the resistive memory cell from the array of resistive memory cells. In one embodiment, the logic is operable to tri-state source line which is coupled to the resistive memory cell from the array of resistive memory cells. In one embodiment, the resistive memory is at least one of: STT-MRAM; ReRAM; PCM; or CBRAM.

In one embodiment, the resistive memory is an STT-MRAM bit-cell which comprises: a select transistor controllable by a word line; and a magnetic tunnel junction (MTJ) device coupled in series with the select transistor.

In another example, in one embodiment, a system comprises, a processor; a wireless interface for allowing the processor to communicate with another device; a memory coupled to the processor, the memory according to any of the apparatus discussed above; and a display unit for displaying content processed by the processor. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a resistive memory cell coupled to a bit line and a select line;
    a first pass-gate coupled to the bit line;
    a second pass-gate coupled to the select line;
    a differential write driver to receive a differential input and to drive a differential output to the first and second pass-gates, wherein the differential write driver to cause a first output of the differential output to have a different drive strength than a second output of the differential output, wherein the differential write driver comprises an adjustable n-type current source; and
    a variable voltage generator to provide a bias for the adjustable n-type current source according to the first or second outputs or both, wherein the variable voltage generator comprises:
    a multiplexer controllable by the first or second outputs or both; and
    a voltage divider to provide a plurality of voltages of different levels to the multiplexer.

2. The apparatus of claim 1, wherein the differential write driver comprises an adjustable p-type current source.

3. The apparatus of claim 2 further comprises a variable voltage generator to provide a bias for the adjustable p-type current source according to the first or second outputs or both.

4. The apparatus of claim 1 further comprises a multiplexer operable by an input data, the multiplexer to provide a control signal to the first and second pass-gates according to logic level of the input data.

5. The apparatus of claim 4, wherein the multiplexer to receive at least two inputs of different pulse widths.

6. The apparatus of claim 5 further comprises logic to adjust pulse widths of the at least two inputs.

7. The apparatus of claim 6, wherein the at least two inputs are first and second write enable pulses, the first write enable pulse for controlling duration of writing a logical high to the resistive memory cell, and the second write enable pulse for controlling duration of writing a logical low to the resistive memory cell.

8. The apparatus of claim 1, wherein the resistive memory cell is at least one of: STT-MRAM; ReRAM; PCM; or CBRAM.

9. The apparatus of claim 1, wherein the resistive memory cell is an STT-MRAM bit-cell which comprises:
    a select transistor controllable by a word line; and
    a magnetic tunnel junction (MTJ) device coupled in series with the select transistor.

10. A system comprising:
    a processor core;
    a memory coupled to the processor core, wherein the memory comprising:
        a resistive memory cell coupled to a bit line and a select line;
        a first pass-gate coupled to the bit line;
        a second pass-gate coupled to the select line; and
        a differential write driver to receive a differential input and to drive a differential output to the first and second pass-gates, wherein the differential write driver to cause a first output of the differential output to have a different drive strength than a second output of the differential output;
        a multiplexer operable by an input data, the multiplexer to provide a control signal to the first and second pass-gates according to logic level of the input data, wherein the multiplexer is to receive at least two inputs of different pulse widths; and
    a wireless interface to allow the processor core to communicate with another device.

11. The system of claim 10, wherein the differential write driver comprises an adjustable p-type current source.

12. The system of claim 11 further comprises a variable voltage generator to provide a bias for the adjustable p-type current source according to the first or second outputs or both.

13. The system of claim 10, wherein the differential write driver comprises an adjustable n-type current source.

14. The system of claim 13 further comprises a variable voltage generator to provide a bias for the adjustable n-type current source according to the first or second outputs or both.

15. An apparatus comprising:
    a resistive memory cell coupled to a bit line and a select line; and
    a differential write driver to receive a differential input and to drive a differential output to first and second pass-gates, wherein the first and second pass-gates are coupled to the resistive memory cell,
    wherein the differential write driver to cause a first output of the differential output to have a different drive strength than a second output of the differential output.

16. The apparatus of claim 15, wherein the differential write driver comprises an adjustable n-type current source.

17. The apparatus of claim 16 further comprises a variable voltage generator to provide a bias for the adjustable n-type current source according to the first or second outputs or both.

* * * * *